United States Patent
Gu

(10) Patent No.: US 7,455,720 B2
(45) Date of Patent: Nov. 25, 2008

(54) METHOD AND APPARATUS FOR PREVENTING PRODUCTS OF TICL$_4$ AND NH$_3$ OR OTHER FEED GAS REACTIONS FROM DAMAGING VACUUM PUMPS IN TIN OR OTHER DEPOSITION SYSTEMS

(75) Inventor: Youfan Gu, Superior, CO (US)

(73) Assignee: MKS Instruments, Inc., Wilmington, MA (US)

( * ) Notice: Subject to any disclaimer, the term of this patent is extended or adjusted under 35 U.S.C. 154(b) by 406 days.

(21) Appl. No.: 11/060,071

(22) Filed: Feb. 16, 2005

(65) Prior Publication Data
US 2006/0180026 A1 Aug. 17, 2006

(51) Int. Cl.
B01D 8/00 (2006.01)
B01D 53/00 (2006.01)
(52) U.S. Cl. .......................... 95/288; 55/385.2; 62/55.5
(58) Field of Classification Search ............. 95/288; 55/385.2; 62/55.5; 427/255.28, 255.391; 422/188
See application file for complete search history.

(56) References Cited
U.S. PATENT DOCUMENTS

| | | | |
|---|---|---|---|
| 5,714,738 A | 2/1998 | Hauschulz et al. | |
| 5,819,683 A | 10/1998 | Ikeda et al. | |
| 5,820,641 A | 10/1998 | Gu et al. | |
| 5,904,757 A * | 5/1999 | Hayashi et al. | ............... 96/416 |
| 6,361,607 B2 * | 3/2002 | Dozoretz et al. | ............ 118/715 |
| 6,506,352 B1 | 1/2003 | Lindfors et al. | |

FOREIGN PATENT DOCUMENTS

JP 60001827 1/1985

* cited by examiner

*Primary Examiner*—Robert A Hopkins
(74) *Attorney, Agent, or Firm*—Cochran Freund & Young LLC; James R. Young

(57) ABSTRACT

In a deposition system, such as a TiN deposition system where TiCl$_4$ and NH$_3$ are reacted in a process chamber to produce TiN thin film coatings, a second reactor is included between the process chamber and the vacuum pump to react enough of the theretofore unreacted feed gases to consume substantially all of at least one of them so that further reactions that could otherwise produce solids, which cause excessive vacuum pump wear, are presented. The second reactor is preferably positioned between a cooled condensation trap downstream from the process chamber and vacuum pump, and it is also applicable in atomic layer deposition (ALD) systems for TiN, WN, and other materials as well as in chemical vapor deposition (CVD) systems for those and other materials.

9 Claims, 1 Drawing Sheet

METHOD AND APPARATUS FOR PREVENTING PRODUCTS OF TICL$_4$ AND NH$_3$ OR OTHER FEED GAS REACTIONS FROM DAMAGING VACUUM PUMPS IN TIN OR OTHER DEPOSITION SYSTEMS

BACKGROUND OF THE INVENTION

1. Field of the Invention

The present invention is related to removing reaction byproducts from reaction effluents in thin film deposition processes and apparatus, and, more specifically, to a method and apparatus for preventing titanium tetrachloride and solid products of titanium tetrachloride reactions with ammonia from forelines of reaction chambers, for example, those in which titanium tetrachloride and ammonia feed gases are reacted to deposit titanium nitride.

2. State of the Prior Art

A common problem in vacuum deposition system, such as low pressure chemical vapor deposition (LPCVD) and atomic layer deposition (ALD) systems, is handling the effluents flowing out of the reaction chambers, including trying to prevent or at least minimize excessive wear in vacuum pumps caused by solid products or byproducts of reactions of feed gases. These problems are often unique to the particular feed gases, reactions, and conditions used in the processes, so solutions to such problems in one deposition system may not be as effective, or even effective at all, in other systems.

One particularly vexing problem has been excessive vacuum pump wear in titanium nitride deposition system, where vacuum pumps typically have useful lives of less than thirty (30) days and often as little as two or three days. Installation of condensation traps, such as that described in U.S. Pat. No. 5,820,641, in the foreline of LPCVD TiN deposition systems have been effective to condense and trap byproducts before they reach and damage the vacuum pumps in some of the older LPCVD TiN deposition systems, but they do not solve the problem in some of the more recent LPCVD TiN deposition systems and practices, as will be discussed in more detail below.

Titanium nitride (TiN) is a very dense material that has a number of uses in thin film form, such as for separating copper or aluminum conductor layers in semiconductor devices from silicon dioxide layers or substrates so that the copper or aluminum ions cannot react with, or diffuse into, the silicon dioxide material. A common method of producing thin films of titanium nitride (TiN) on substrates is to react titanium tetrachloride (TiCl$_4$) with ammonia (NH$_3$) in a low pressure, chemical vapor deposition (LPCVD) process chamber. The chemical reactions inside the process chamber (sometimes also called the reaction chamber) include the following:

Deposition of TiN:

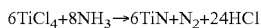

$$6TiCl_4 + 8NH_3 \rightarrow 6TiN + N_2 + 24HCl \quad (1)$$

Formation of ammonium chloride:

$$NH_3 + HCl \rightarrow NH_4Cl \quad (2)$$

Dissociation of TiCl$_4$:

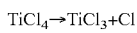

$$TiCl_4 \rightarrow TiCl_3 + Cl \quad (3)$$

Adduct formation in the gas phase:

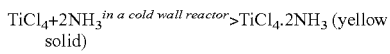

$$TiCl_4 + 2NH_3 \xrightarrow{\text{in a cold wall reactor}} TiCl_4 \cdot 2NH_3 \text{ (yellow solid)} \quad (4)$$

The target reaction for the deposition of TiN on a substrate in the process chamber is, of course, equation (1) above. The other reactions (2), (3), and (4) are superfluous for the deposition of TiN, but they cannot be avoided. The ammonium chloride (NH$_4$Cl) produced according to equation (2) and the TiCl$_4$·2NH$_3$ adduct produced according to equation (4) are by-products which are condensable to solid materials, and, when they condense to solid materials in the foreline and vacuum pump components, they cause the abnormal wear and damage to vacuum pumps discussed above. The ratio of the desirable TiN to the undesirable TiCl$_4$·2NH$_3$ produced in the process is very small, so there are large amounts of TiCl$_4$·2NH$_3$ produced. Fortunately, however, since TiCl$_4$·2NH$_3$ condenses readily to a yellow solid, a water-cooled trap in the foreline has been quite effective for trapping and removing substantially all of the TiCl$_4$·2NH$_3$ adduct from the process chamber effluent before it could reach and damage the vacuum pump in conventional LPCVD TiN deposition systems where the reactant feed gases are turned on only during deposition and are turned off when the coated products are being removed from the chamber.

However, a more recent practice of diverting vaporized TiCl$_4$ around the process chamber and dumping it directly into the foreline or directly into the water cooled trap while the TiN coated wafer substrates are removed from the process chamber and replaced with new, uncoated wafer substrates has been found to produce a different byproduct in the form of a yellow powder in addition to the usual yellow solid, and the conventional water-cooled condensation traps used to prevent the solid TiCl$_4$·2NH$_3$ adduct from damaging the vacuum pump are ineffective at preventing the yellow powder byproduct from reaching and damaging the pump. It has also been observed that the conventional water-cooled condensation traps do not prevent solid TiCl$_4$·2NH$_3$ from also damaging the vacuum pump when TiCL$_4$ is diverted around the process chamber as described above. This TiCl$_4$ diversion and dumping practice is becoming more common, because TiCl$_4$ is normally liquid at room temperature and has to be vaporized for feeding into the process chamber. Vaporizers cannot be turned on and off instantaneously, so, in this more recent practice, they are left on to operate at a steady state, and the flow of TiCl$_4$ vapor is simply diverted around the process chamber by a three-way valve or other appropriate valve mechanism when the wafers are being changed. Then, when the new wafers are in position and the process chamber is closed and ready for deposition, the flow of TiCl$_4$ is switched back into the process chamber to react with the NH$_3$. The practice enables almost instantaneous on/off control of the TiCl$_4$ vapor flow into the process chamber, but it adds substantial amounts of unreacted TiCl$_4$ downstream of the process chamber, and the vacuum pump life has become extremely short when this practice is used.

Similar problems are encountered in atomic layer deposition (ALD) processes in which the reactant respective feed gas flows into the process chambers are switched alternately on and off as depositions are built one atomic layer at a time. For example, atomic layer deposition of TiN involves alternating sequential, pulsed flows of TiCl$_4$, a purge with N$_2$, then a pulse of NH$_3$, followed by another purge with N$_2$, and starting over again with the TiCl$_4$. These sequential pulses of reactant gases TiCl$_4$ and NH$_3$ in a high temperature, low pressure reaction chamber result in atomic layer deposition of TiN on a wafer substrate in the process chamber, but portions of the feed gas that do not react in the process chamber mix with each other and react downstream in the foreline and vacuum pump to cause the same excessive wear problems in the vacuum pump as described above.

SUMMARY OF THE INVENTION

Accordingly, an object of this invention is to decrease wear and prolong the useful lives of vacuum pumps in LPCVD, ALD, and other deposition systems.

A more specific object of this invention is to decrease or prevent excessive wear in vacuum pumps downstream from process chambers in which large amounts of $TiCl_4$ and $NH_3$ not reacted in the process chambers cause wear and damage to the vacuum pumps.

Another specific object of this invention is to prevent $TiCl_4$ that is diverted around process chambers and dumped into the foreline downstream from the process chambers during non-deposition stages of LPCVD, ALD, and other TiN deposition system process cycles from damaging or causing excessive wear in vacuum pumps of such systems.

Additional objects, advantages, and features of the invention will be set forth in the description that follows. These and other objects and advantages can be realized and attained by the instrumentalities and in combinations recited in the appended claims.

To achieve the foregoing and other objects, a second reactor is positioned in a foreline between the process chamber and the vacuum pump to react enough of the theretofore unreacted feed gases to consume all of at least one of the feed gases that is necessary to the reaction or reactions that produces the solid byproducts that cause excessive wear in the vacuum pump. In LPCVD TiN deposition systems, there is usually more $NH_3$ present in the effluent than $TiCl_4$, so such reaction in the second reactor will usually consume all the $TiCl_4$. However, in ALD processes, it may consume all of one or the other or all of both of the feed gases.

BRIEF DESCRIPTION OF THE DRAWINGS

The accompanying drawing, which is incorporated in and forms a part of the specification, illustrates embodiments of the present invention, and together with the description, serves to explain the principles of the invention. In the drawing.

DETAILED DESCRIPTION OF THE PREFERRED EMBODIMENTS

Figure 1:
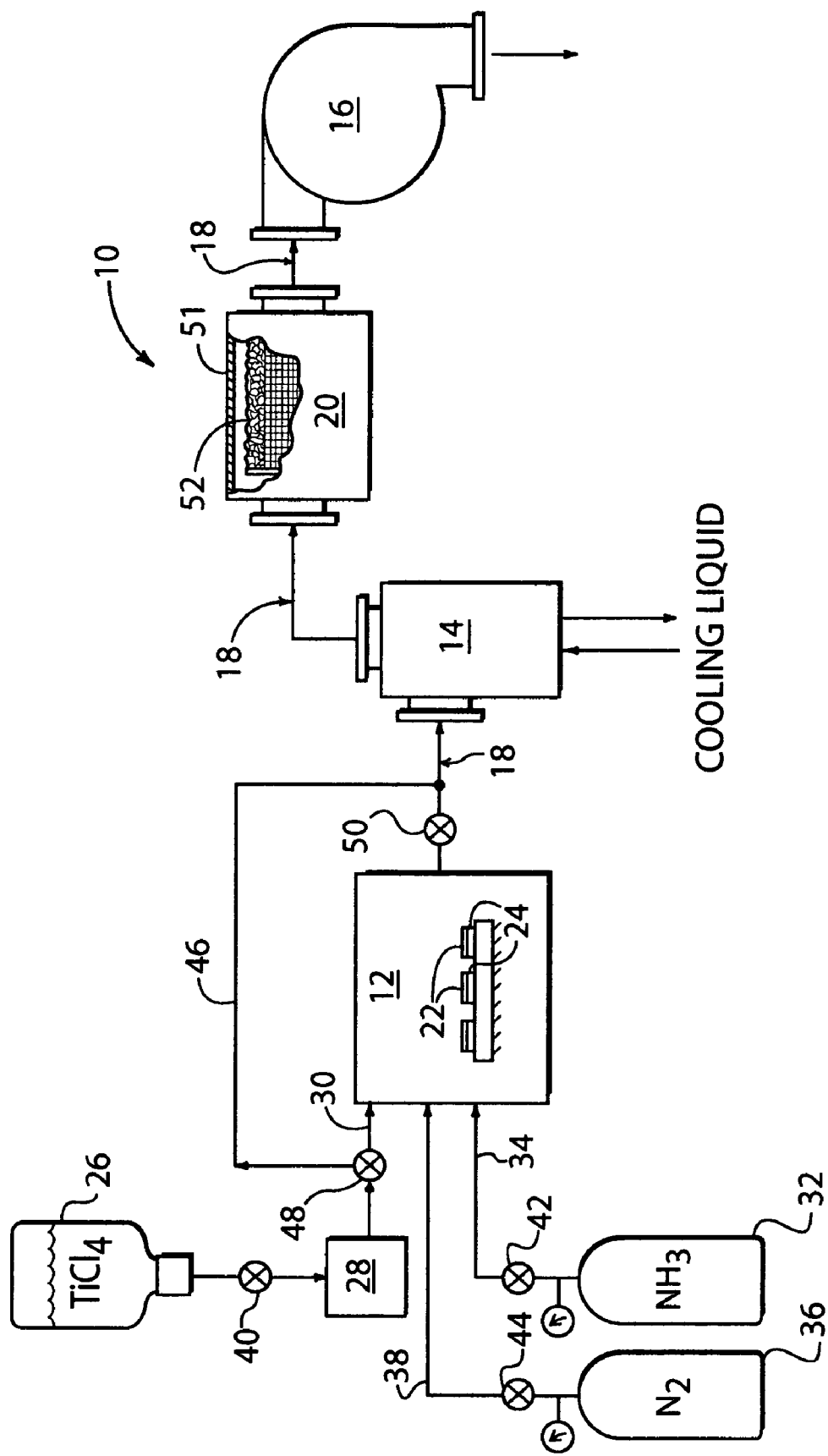
FIG. 1 is a schematic diagram of a deposition system in which $TiCl_4$ and $NH_3$ are reacted to produce TiN thin film coatings and includes the second reactor in the foreline according to this invention.

An example deposition system 10 in FIG. 1 illustrates an implementation of the method and apparatus of this invention. In this example, the process chamber 12 (sometimes also called the "reaction chamber" or "main reaction chamber"), condensation trap 14, and vacuum pump 16 have been used in combination with each other in the prior art, including, but not limited to, titanium nitride (TiN) low pressure, chemical vapor deposition (LPCVD) systems in which titanium tetrafluoride ($TiCl_4$) is reacted with ammonia ($NH_3$) to produce thin films of TiN. The second reactor 20 positioned in the foreline 18 between the condensation trap 14 and the vacuum pump 16 to react and thereby remove substantially all remaining $TiCl_4$ and/or $NH_3$ from the process effluent gas flow before it reaches the vacuum pump 16 is a significant feature of this invention, as will be described below. It is called the "second reactor" or "second reaction chamber" in this description, because the primary reaction for producing the thin film coating 22 on wafers 24 occurs in the process chamber 12.

To explain the operation and significance of the second reactor 12 in the system 10, it is helpful to provide some description of an example deposition process such as a TiN deposition process. TiN is deposited in thin films 22 on wafer substrates 24 positioned in the main reaction chamber (process chamber) 12 by reacting $TiCl_4$ with $NH_3$ according to the equation (1) above. $TiCl_4$ is a liquid at room temperature, as indicated schematically by the source container 26, so it has to be vaporized before introducing it into the process chamber 12. Such vaporization of the $TiCl_4$ can be performed by any conventional vaporizer 28, as is well known by persons skilled in the art. The vaporized $TiCl_4$ is fed by a conduit 30 into the reaction chamber 12. The $NH_3$ has a lower vapor pressure and can be fed as a gas directly from a source container 32 via a conduit 34 to the reaction chamber 12. A purge gas, such as nitrogen ($N_2$), which is inert to the reactions (1) through (4), can also be provided to purge the reactive feed gases $TiCl_4$ and $NH_3$ out of the reaction chamber 12, when the TiN deposition is complete and the coated wafers 24 have to be removed and replaced with new, uncoated wafers. In FIG. 1, the purge gas is illustrated schematically as $N_2$ from a source container 36, which can be fed through a conduit 38 to the reaction chamber 12, although other purge gases and piping arrangements can be used, as would be readily apparent to persons skilled in the art.

In the reaction chamber 12, all four of the reactions shown by equations (1)-(4) above take place. In traditional, smaller scale, and laboratory TiN deposition systems, the $TiCl_4$ and $NH_3$ feed gases are turned on to start and sustain the reactions (1)-(4) during deposition of TiN, and they are turned off in order to end the reactions. Such on and off, starting and stopping of the feed gas flows as well as mass flow control of those gases can be done with any appropriate, well-known valving, as indicated schematically by valves 40, 42, respectively, in FIG. 1. Likewise, the purge gas can be turned on and off and controlled by any appropriate, well-known valving, as indicated schematically by valve 44 in FIG. 1.

In a typical TiN deposition process, there is much more $NH_3$ feed gas flowed into and through the reaction chamber 12 than $TiCl_4$—for example, as much as ten times more $NH_3$ than $TiCl_4$. Also, as mentioned above, the amount of TiN produced is small compared to the amounts of $TiCl_4.2NH_3$ adduct and $NH_4Cl$ produced in the process chamber 12. The TiN has a very low vapor pressure, so it never gets out of the process chamber 12 and is not a problem downstream from the reaction chamber 12. In the high temperature of the reaction chamber 12, typically at least 200° C. and often significantly higher, the remaining $TiCl_4$ and $NH_3$ that do not get reacted according to equation (1) to produce TiN will react according to equation (4) to form the $TiCl_4.2NH_3$ adduct, which is condensable to a yellow solid. The $NH_4Cl$ is also condensable. Therefore, the $TiCl_4.2NH_3$ adduct and the $NH_4Cl$ formed in the process chamber 12 can be trapped in a condensation trap 14, especially a cooled trap 14, such as the liquid cooled trap described in U.S. Pat. No. 5,820,641, issued to Gu et al., which is incorporated herein by reference for all that it discloses. That and other condensation traps have been used for this purpose, and the portion of the foreline 18 between the reaction chamber 12 and the condensation trap 14 is often kept hot to prevent the $TiCl_4.2NH_3$ and $NH_4Cl$ from condensing before they reach the trap. Pipe heaters (not shown) for keeping the foreline hot are also well-known, for example, those disclosed in U.S. Pat. No. 5,714,738.

On the other hand, in the more recent LPCVD and TiN ALD processes, where substantial amounts of $TiCl_4$ and $NH_3$ are fed unreacted into the foreline 18, as described above, a yellow powder is produced, which is not trapped effectively by the condensation trap 14. A significant part of this invention is the discovery that the yellow powder comprises different adducts, i.e., $TiCl_4.4NH_3$ and $TiCl_4.8NH_3$, than the condensable $TiCl_4.2NH_3$ adduct produced in the high temperatures of the process chamber 12, and that production of these $TiCl_4.4NH_3$ and $TiCl_4.8NH_3$ adducts is more predominant at lower temperatures, such as those typically occurring in the foreline 18 downstream from the cooled condensation trap 14. In general, temperatures above 180° C. tend to favor production of $TiCl_4.2NH_3$, whereas room temperature favors production of $TiCl_4.4NH_3$ adduct, and low temperatures, e.g., less than −30° C., favor production of $TiCl_4.8NH_3$. Some $TiCl_4.2NH_3$, $TiCl_4.4NH_3$, and $TiCl_4.8NH_3$ can be produced at all of these temperatures, but at temperatures below 180° C., $TiCl_4.4NH_3$ and $TiCl_4.8NH_3$ production from available $TiCl_4$ and $NH_3$ in the foreline 18 instead of $TiCl_4.2NH_3$ becomes significant enough to warrant remediation directed to $TiCl_4.4NH_3$ and $TiCl_4.8NH_3$ adducts in addition to that provided by the condensation trap 14 for the $TiCl_4.2NH_3$ adduct produced in the process chamber 12.

As mentioned above, any unreacted $TiCl_4$ and $NH_3$ in the foreline 18 are not trapped effectively by the condensation trap 14 and neither is $TiCl_4.4NH_3$ and $TiCl_4.8NH_3$. Therefore, unless stopped in some other manner, such $TiCl_4.4NH_3$ and $TiCl_4.8NH_3$ can and will reach the vacuum pump 16 and cause excessive wear and damage. However, any unreacted $TiCl_4$ and $NH_3$, which has not formed $TiCl_4.nNH_3$ (n=2, 4, and/or 8), TiN, or $NH_4Cl$ in the process chamber 12 or in the foreline 18, can also be a problem, because such unreacted $TiCl_4$ and $NH_3$ gases can also reach the vacuum pump 16, where the high temperatures in the vacuum pump 16 are favorable to reaction. Such reaction of the $TiCl_4$ and $NH_3$ in the vacuum pump 16 also produces $TiCl_4.nNH_3$ (n=2, 4, and/or 8) adduct(s) and $NH_4Cl$, which cause extreme wear and very short pump lifetimes.

As mentioned above, these problems from $TiCl_4.nNH_3$ (n=2, 4, and/or 8) adducts is exacerbated by the practice of turning the flow of $TiCl_4$ feed gas for the reaction chamber 12 on and off by simply diverting the vaporized $TiCl_4$ feed gas through a bypass conduit 46 around the process chamber 12 and dumping it into the foreline 18 downstream from the process chamber 12, whenever the reactions in the chamber 12 are to be stopped in order to remove the coated wafers 24 and replace them with new wafers to be coated. This $TiCl_4$ bypass practice is becoming more common in production TiN deposition systems, because the vaporizers 28 are slow to respond, i.e., slow to start and stop, which makes it difficult to achieve stable mass flow rates, when the vaporizer is being switched on and off in repeated sequences or cycles. On the other hand, the three-way diversion valve 48 can be actuated almost instantaneously to switch the $TiCl_4$ feed gas flow from the feed conduit 30 to the bypass conduit 46 and vice versa, while the $TiCl_4$ vaporizer 28 remains operating at a steady mass flow rate. However, since there are usually large amounts of unreacted $NH_3$ flowing through the process chamber 12 and into the foreline 18, the additional unreacted $TiCl_4$ dumped into the foreline 18 by this practice along with the unreacted $NH_3$ in the process chamber 12 effluent causes even more reaction and production of $TiCl_4.nNH_3$ (n=2, 4, and/or 8) and $NH_4Cl$ in the foreline 18 and vacuum pump 16.

According to this invention, therefore, to remediate this problem of excessive pump 16 wear and damage due to $TiCl_4.nNH_3$ (n=2, 4, and/or 8) adduct formation in the foreline 18 and pump 16, a second reactor 20 is positioned between the condensation trap 14 and the vacuum pump 16 to promote reaction of the previously unreacted $TiCl_4$ and $NH_3$ in the foreline 18 and to condense and retain the resulting $TiCl_4.nNH_3$ (n=2, 4, and/or 8) and $NH_4CL$ products of such reaction before they reach the pump 16. It is preferred, therefore, that the second reactor 20 should be effective to react all of the $TiCl_4$ remaining in the gas stream so that any unreacted $NH_3$ left in the gas stream is rendered harmless. In other words, with no $TiCl_4$ left in the gas flow after the second reactor 20, any remaining $NH_3$ in the gas flow after the second reactor 20 is harmless to the vacuum pump 16 and can pass through the vacuum pump 16 with no adverse effects. Even with the high local temperatures in the vacuum pump, no harmful $TiCl_4.2NH_3$ or other $TiCl_4.4NH_3$ or $TiCl_4.8NH_3$ adducts can form in the pump 16, because there is no more $TiCl_4$ in the gas flow after the second reactor 20.

The second reactor 20 can include a housing 51 that contains a mesh or screen flow impeding medium 52 with a high surface density between a gas flow inlet and a gas flow outlet, such as the TEOS trap apparatus described in U.S. Pat. No. 6,361,607, which is incorporated herein by reference for all that is discloses. In fact the TEOS trap apparatus described in U.S. Pat. No. 6,361,607 or variation thereof is very suitable for use as the second reactor 20 in this invention. The $NH_3$ molecules are polar and tend to cling to the surfaces of the mesh or screen medium 52, where they are retained long enough to react with all of the $TiCl_4$ molecules available in the gas flow, thereby depleting the gas flow of (unreacted) $TiCl_4$ molecules. The mesh or screen medium also helps to condense the $TiCl_4.nNH_3$ (n=2, 4, and/or 8) and $NH_4Cl$ products of the reactions and retain them so that they cannot reach the vacuum pump 16. With no remaining $TiCl_4$ in the gas flow drawn into the vacuum pump 16, the remaining $NH_3$ simply passes through the vacuum pump 16 without harming it.

In many situations, the second reactor 20 can be operated at room temperature, which produces more of the $TiCl_4.4NH_3$ and $TiCl_4.8NH_3$ adducts than $TiCl_4.2NH_3$, but they are solids, e.g., powder, at room temperature and will be retained by the mesh or screen medium 52 in the second reactor 20. In fact, the combination of the liquid cooled trap 14 and the second reactor 20 is particularly effective. In the hot process chamber 12, more $TiCl_4.2NH_3$ adduct is produced than the $TiCl_4.4NH_3$ and $TiCl_4.8NH_3$ adducts, but the liquid cooled trap 14 condenses such $TiCl_4.2NH_3$ to solids and captures them, as described above, even though unreacted $TiCl_4$ and $NH_3$ as well as $TiCl_4.4NH_3$ and $TiCl_4.8NH_3$ powders can pass through the condensation trap 14. However, the liquid cooled trap 14 also is effective to cool the unreacted $TiCl_4$ and $NH_3$ vapors, so the $NH_3$ sorbs more readily and stays longer on the surfaces of the mesh or screen medium 52 in the second reactor 20 than it would if it was not cooled. Therefore, the second reactor 20 is more effective at promoting reactions of the remaining $TiCl_4$ in the gas flow with $NH_3$ to form the lower temperature $TiCl_4.4NH_3$ and $TiCl_4.8NH_3$ adducts than if it was operated alone, without the liquid cooled trap 14, and those adducts are retained by the mesh or screen medium 52.

For example, the process chamber 12 in a typical TiN deposition system is operated in a range of 400 to 700° C. at a pressure of about 0 to 100 torr, and the process time for depositing a thin film of TiN is about 20 to 60 seconds, depending on the thin film thickness desired, and with process feed gas rates of 250 to 350 mgm (milligrams per minute) for $TiCl_4$ and 100 to 200 sccm (standard cubic centimeters per minute) for the $NH_3$. Carrier gases of about 4,000 to 5,000 sccm of helium (He) for the $TiCl_4$ and about 7,000 to 8,000 sccm of nitrogen ($N_2$) for the $NH_3$ are typical. Therefore, the temperature of the gas flow in the foreline 18 will decrease dramatically due to its low mass flow rate, so it will be cooled rapidly by the metal conduit of the foreline 18. Typically, the gas temperature is close to ambient temperature just a few feet after the process chamber 12 exit, and as mentioned above, pipe heaters (not shown) are often used on the section of the foreline 18 between the main reaction chamber 12 and the condensation trap 14 to prevent condensation of $TiCl_4 \cdot nNH_3$ (n=2, 4, and/or 8) and $NH_4Cl$ in the foreline 18 before it reaches the trap 14. A throttle valve 50 in the foreline 18 is used to maintain the pressure in the process chamber, so the pressure in the foreline 18 after the throttle valve 50 is typically in a range of about 0.05 to 5 torr. Therefore, the gas flow comprising unreacted $TiCl_4$, unreacted $NH_3$, carrier gases He and $N_2$, $TiCl_4 \cdot 2NH_3$ adduct, possibly small amounts of $TiCl_4 \cdot 4NH_3$ and $TiCl_4 \cdot 8NH_3$ adducts, and $NH_4Cl$ enters the condensation trap 14 at a temperature of about 150 to 180° C. and a pressure of about 0.05 to 5 torr. If the condensation trap 14 is liquid cooled, the temperature of the gas flow is cooled down to about 20 to 40° C. at the outlet of the trap 14. As explained above, practically all of the $TiCl_4 \cdot 2NH_3$, $TiCl_4 \cdot 2NH_3$, $TiCl_4 \cdot 2NH_3$, and $NH_4Cl$ in the gas flow entering the trap 14 is condensed and trapped by the trap 14. However, the trap 14 is designed to produce condensation, not reactions, so there is very little, if any, reaction and production of $TiCl_4 \cdot nNH_3$ and $NH_4Cl$ from the theretofore unreacted $TiCl_4$ and $NH_3$ in the condensation trap 14. Consequently, almost all of the unreacted $TiCl_4$ and $NH_3$ in the gas flow that enters the condensation trap 14 continue to flow with the carrier gas through the condensation trap 14, where it is cooled to a temperature of about 20 to 40° C., to the second reactor 20. The cooled $TiCl_4$ and especially the cooled $NH_3$ from the condensation trap 14 is sorbed by the mesh or screen medium 52 in the second reactor 20, which promotes reaction of the $TiCl_4$ and $NH_3$. At room temperature, the reaction of $TiCl_4$ and $NH_3$ produces more $TiCl_4 \cdot 4NH_3$ and $TiCl_4 \cdot 8NH_3$ adducts than $TiCl_4 \cdot 2NH_3$, as well as some $NH_4Cl$, practically all of which are solids or condense to solids at that temperature and are retained by the mesh or screen medium 52. Enough medium 52 with enough surface density is provided to promote reaction of substantially all of the $TiCl_4$ in the gas stream, so the effluent gas flow leaving the second reactor 20 is practically devoid of $TiCl_4$. The words "substantially" and "practically" are used herein, because, as persons skilled in the art understand, it is unlikely that every single molecule of $TiCl_4$ will be consumed in the second reactor 20, but any small amount of unreacted $TiCl_4$ that may be left in the gas flowing out of the second reactor 20 is so insignificant as to not be an economic concern in the useful life of the vacuum pump 16. For quantification, this terminology can be considered to mean that the $TiCl_4 \cdot nNH_3$ (n=2, 4, and/or 8) adducts and $NH_4Cl$ in the gas flow after the second reactor 20 do not cause the vacuum pump to have a useful life of less than fourteen (14) days, which is a significant improvement over one to three days without the second reactor 20.

It is also desirable to have enough volume of the medium 52 to enable operation of the system for a reasonable period of time without clogging or preventing achievement of the desired operating pressure in the main reaction chamber 12, e.g., 0.05 torr. When the medium 52 does finally get full enough to approach clogging, it can be removed and replaced with a new medium 52. The appropriate size, thickness, and surface density of the mesh or screen medium 52 to satisfy these criteria depends on the particular operating parameters of the system, including, but not limited to, the size of the vacuum pump, sizes of the forelines, volumes and mass flow rates of the feed and carrier gases, and temperatures and pressures at various parts of the system. Persons skilled in the art are capable of determining appropriate sizes, thicknesses, surface densities, and volumes of the medium 52 to meet these criteria for various deposition system parameters. In general, stainless steel or other metal, fiberglass, or ceramic mesh or screen medium 52 with surface density (Surface Area/Unit Volume) in a range of about 2.5 $in^2/in^3$ to 13.5 $in^2/in^3$ is effective for the second reactor 20. The second reactor 20 should also be as close as possible to the condensation trap 14, because any foreline 18 section between the condensation trap 14 and the second reactor 20 will not be very clean due to continuing $TiCl_4/NH_3/HCl$ reactions that occur in the foreline 18. Close proximity of the second reactor 20 to the condensation trap 20 or even combining them in one housing (not shown) can reduce or eliminate that problem.

In this regard, it is also appropriate to mention that different sizing may be required in atomic layer deposition (ALD) systems than in conventional LPCVD systems to meet these criteria for vacuum pump useful life, because the feed gases are flowed through ALD systems in alternate pulses instead of steady state flow rates, often with intervening pulses of purge gases between the pulses of reactive gases. Therefore, much less of the $TiCl_4 \cdot nNH_3$ (n=2, 4, and/or 8) adducts and $NH_4Cl$ are produced in the process chamber 12 and caught by the condensation trap 14. Therefore, in ALD systems, the condensation trap 14 can be smaller, and the second reactor 20 may have to be larger than in conventional LPCVD systems. Either feed gas $TiCl_4$ or $NH_3$ alone can pass through the vacuum pump 16 without causing abnormal or excessive wear. Excessive wear is caused in the vacuum pump 16 only when the gases react and produce solids that either get into or form in the vacuum pump 16. Therefore, elimination of either one of the feed gases, for example either one of the $TiCl_4$ or the $NH_3$ in a TiN ALD system, will eliminate this cause of excessive wear in the vacuum pump 16. Therefore, it is important that the second reactor 20 is large enough to react and consume all of at least one of the reactive gases that happen to be present together in the second reactor 20 at any instant in time during the ALD process. It is also important that the second reactor 20 be positioned as close as possible to the vacuum pump 16 to prevent separate reaction gas pulses that pass through the second reactor 20 from being delayed and mixed together in a long foreline 18 section between the second reactor 20 and the vacuum pump 16, which would enable them to react before or in the vacuum pump 16 to produce solids and cause excessive wear in the vacuum pump 16.

In a TiN ALD system, the second reactor 20 can usually be operated at room temperature, because the $TiCl_4$ and $NH_3$ react at room temperature to produce the $TiCl_4 \cdot 4NH_3$ and $TiCl_4 \cdot 8NH_3$ adducts, which consumes the reactant gases. However, in other ALD systems, such as WN, the second reactor 20 may have to be operated at higher temperatures to react feed gases, such as $WF_6$, $B_2H_6$, and $NH_3$, which only react at such higher temperatures, such as 150 to 300° C., before they reach the vacuum pump 16. Again, persons skilled in the art can make these specific second reactor design determinations for specific ALD or LPCVD systems, once they understand the principles and benefits of the use of the second reactor 20.

Since these and numerous other modifications and combinations of the above-described method and embodiments will readily occur to those skilled in the art, it is not desired to limit the invention to the exact construction and process shown and described above. Accordingly, resort may be made to all suitable modifications and equivalents that fall within the scope of the invention as defined by the claims which follow. The words "comprise," "comprises," "comprising," "have," "having," "include," "including," and "includes" when used in this specification and in the following claims are intended to specify the presence of stated features or steps, but they do The invention and several embodiments in which an exclusive property or privilege is claimed is defined as follows:

1. A method of protecting a vacuum pump connected by a foreline to a process chamber in a TiN deposition system from wear caused by solid products of reactions of $TiCl_4$ and $NH_3$ feed gases, comprising:

condensing and trapping condensable $TiCl_4 \cdot nNH_3$ (n=2, 4, and/or 8) and $NH_4Cl$ byproducts of reactions of the $TiCl_4$ and $NH_3$ that flow out of the process chamber and into the foreline before those byproducts of the reactions in the process chamber reach the vacuum pump; and providing a second reactor in the foreline between the process chamber and the vacuum pump with adsorption surfaces to sorb and react enough of theretofore unreacted $TiCl_4$ and $NH_3$ feed gases that flow through the process chamber and foreline to consume substantially all of at least one of the theretofore unreacted $TiCl_4$ and $NH_3$ feed gases and to retain solid products of such reactions in the second reactor so that at least one of $TiCl_4$ and $NH_3$ feed gases does not reach the vacuum pump.

2. The method of claim 1, including:

providing a cooled condensation trap in the foreline between the process chamber and the vacuum pump for said condensing and trapping condensable $TiCl_4 \cdot nNH_3$ (n=2, 4, and/or 8) and $NH_4Cl$; and positioning second reactor in the foreline between the cooled condensation trap and the vacuum pump.

3. The method of claim 2, including maintaining the second reactor at room temperature.

4. A method of protecting a vacuum pump connected by a foreline to a process chamber in a deposition system from wear caused by solid products of reactions of at least two feed gases, comprising:

positioning a condensation trap in the foreline between the process chamber and the vacuum pump for condensing condensable products of reactions of the feed gases, which flow with carrier gases and unreacted portions of the feed gases out of the process chamber and into the foreline; and positioning a second reactor between the condensation trap and the vacuum pump for reacting theretofore unreacted portions of the feed gases that have passed through the condensation trap, including reacting enough of the theretofore unreacted feed gases to consume substantially all of at least one of the theretofore unreacted feed gases to thereby render the gas flow reaching the vacuum pump practically devoid of said at least one of the theretofore unreacted feed gases.

5. The method of claim 4, including providing adsorption surfaces in the second reactor to retain at least one of the theretofore unreacted feed gases for reaction of the feed gases in the second reactor.

6. The method of claim 4, including maintaining the temperature of the second reactor at a temperature that allows the reaction of the feed gases.

7. The deposition apparatus of claim 6, wherein the second reactor includes a adsorption medium with a surface density in a range of 2.5 to 13.5 $in^2/in^3$ in a housing between an inlet and an outlet.

8. Deposition apparatus, comprising:

a process chamber for reacting two feed gases to produce a thin film of material;

a vacuum pump connected by a foreline to the process chamber;

a condensation trap positioned in the foreline between the process chamber and the vacuum pump for condensing and trapping condensable products of reactions of the feed gases;

second reactor means between the condensation trap and the vacuum pump for reacting enough of theretofore unreacted feed gases that have passed through the condensation trap to consume and deplete substantially all of at least one of the feed gases before it reaches the vacuum pump.

9. The apparatus of claim 8, wherein the condensation trap is cooled to cool the theretofore unreacted feed gases before they reach the second reactor means as well as to cause the condensation of the condensable products of the reactions that occur in the process chamber.

* * * * *